United States Patent
Kraipak et al.

(10) Patent No.: US 12,147,299 B1
(45) Date of Patent: Nov. 19, 2024

(54) MECHANISM FOR IMPROVED DATA AVAILABILITY FOR DRAM IN THE PRESENCE OF UNCORRECTABLE ERRORS

(71) Applicant: Marvell Asia Pte Ltd, Singapore (SG)

(72) Inventors: Waseem Kraipak, Hyderabad (IN); Brian Michael Rogers, Durham, NC (US); Pradipkumar Arunbhai Thaker, Bangalore (IN)

(73) Assignee: Marvell Asia Pte Ltd, Singapore (SG)

( * ) Notice: Subject to any disclaimer, the term of this patent is extended or adjusted under 35 U.S.C. 154(b) by 7 days.

(21) Appl. No.: 18/160,958

(22) Filed: Jan. 27, 2023

Related U.S. Application Data

(60) Provisional application No. 63/395,288, filed on Aug. 4, 2022.

(51) Int. Cl.
*G06F 11/10* (2006.01)
*G11C 29/52* (2006.01)

(52) U.S. Cl.
CPC ...... *G06F 11/1044* (2013.01); *G06F 11/1068* (2013.01); *G11C 29/52* (2013.01)

(58) Field of Classification Search
CPC ... G06F 11/1044; G06F 11/1068; G11C 29/52
See application file for complete search history.

(56) References Cited

U.S. PATENT DOCUMENTS

| | | | | |
|---|---|---|---|---|
| 11,537,528 B1* | 12/2022 | Lercari | ............... | G06F 12/0246 |
| 2021/0350870 A1* | 11/2021 | Ware | ................ | G06F 11/1016 |
| 2024/0061744 A1* | 2/2024 | Uribe | ............... | G06F 11/1068 |

FOREIGN PATENT DOCUMENTS

EP   3955112 A1 *   2/2022   ......... G06F 11/1004

* cited by examiner

*Primary Examiner* — Samir W Rizk
(74) *Attorney, Agent, or Firm* — Hamilton, Brook, Smith & Reynolds, P.C.

(57) ABSTRACT

Disclosed is a method of recovering corrupted data, comprising providing a FIFO storage structure on the memory controller, and providing an error correction code (ECC) generator to the memory device, the ECC generator configured to generate ECC check bits based on a data word. For each data word, the method comprises storing a copy of the data word, appended check bits, and associated address into the FIFO storage structure; generating expected check bits based on the data word; when the expected check bits match the appended check bits, storing the data word and appended check bits to the memory device; and when the expected check bits do not match the appended check bits, and an error in the data word is uncorrectable, replacing the data word and appended check bits with the copy of the data word and appended check bits that were stored in the FIFO storage structure.

24 Claims, 3 Drawing Sheets

MECHANISM FOR IMPROVED DATA AVAILABILITY FOR DRAM IN THE PRESENCE OF UNCORRECTABLE ERRORS

RELATED APPLICATION

This application claims the benefit of U.S. Provisional Application No. 63/395,288, filed on Aug. 4, 2022. The entire teachings of the above application are incorporated herein by reference.

BACKGROUND

In a processor architecture, for example a processor system on chip (SOC), a processor core writes data to and reads data from an external (to the SOC) memory device such as a dynamic random-access memory (DRAM). FIG. 1 illustrates a high-level view of such an architecture. A processor SOC 10 may comprise one or more processor cores 12 that communicate with one or more memory controllers 14 (such as a double data rate (DDR) controller) through a coherent fabric 16. The DDR controller 14 communicates with a memory device such as a DRAM 18 through physical electrical couplings 20. The DDR controller 14 schedules the data reads and writes requested by the processor core 12.

The communication protocol between the DDR controller 14 and the DRAM 18 includes an error correction code (ECC) that may detect certain errors in the transmitted/stored data, and may correct some of the detected errors. Some of the errors may, however, elude the ECC.

SUMMARY

The embodiments described herein are directed to improving robustness and reliability of the data interface between a processor SOC and associated external memory (e.g., dynamic random-access memory (DRAM)). The described embodiments improve robustness and reliability of SOC-to-external memory by implementing additional evaluation of the error correcting code (ECC) check bits, and providing additional avenues for correcting data errors that cannot be corrected by the ECC processing.

In one aspect, the invention may be a method of recovering data that has been corrupted at an interface between a memory controller and a memory device, comprising providing a data storage structure on the memory controller, and providing an error correction code (ECC) generator to the memory device. The data storage structure may be a first-in-first-out (FIFO) data structure. The ECC generator may be configured to generate ECC check bits based on a data word. For each data word, appended ECC check bits, and associated address that is conveyed from the memory controller to the memory device, (i) storing a copy of the data word, appended ECC check bits, and associated address into the data storage structure, (ii) generating, by the ECC generator, expected ECC check bits based on the data word, (iii) when the expected ECC check bits match the appended ECC check bits, storing the data word and appended ECC check bits to the memory device, (iv) when the expected ECC check bits do not match the appended ECC check bits, and an error in the data word cannot be corrected, replacing the data word and appended ECC check bits with the copy of the data word and appended ECC that was stored in the data storage structure.

An embodiment further comprises communicating, by the memory device to the memory controller, that the data word is corrupted and cannot be corrected through a sideband channel. The method may further comprise communicating, by the memory device to the memory controller, that the data word is corrupted and cannot be corrected through a direct connection from the memory device to the memory controller. The method may further comprise communicating, by the memory device, the physical address associated with the corrupted data word through a sideband channel. The method may further comprise implementing the sideband channel with an inter-integrated circuit (I2C) protocol channel. The data storage structure may be configured to store five data words and respective appended ECCs.

In another aspect, the invention may be an apparatus configured to recover data that been corrupted at an interface between a memory controller and a memory device. The invention may comprise a data storage structure disposed on the memory controller, and an error correction code (ECC) generator disposed on the memory device. The data storage structure may be a first-in-first-out (FIFO) data structure. The ECC generator may be configured to generate ECC check bits based on a data word. For each data word, appended ECC check bits, and associated address conveyed from the memory controller to the memory device, the apparatus may be configured to (i) store a copy of the data word, appended ECC check bits, and associated address into the data storage structure, (ii) generate, by the ECC generator, expected ECC check bits based on the data word, (iii) when the expected ECC check bits match the appended ECC check bits, store the data word and appended ECC check bits to the memory device, and (iv) when the expected ECC check bits do not match the appended ECC check bits, and an error in the data word cannot be corrected, replace data word and appended ECC check bits with the copy of the data word and appended ECC stored in the data storage structure.

The memory device may communicate to the memory controller through a sideband channel that the data word is corrupted and cannot be corrected. The memory device may communicate to the memory controller, through a direct connection from the memory device to the memory controller, that the data word is corrupted and cannot be corrected. The memory device communicates to the memory controller the physical address associated with the corrupted data word through a sideband channel. The sideband channel is implemented with an inter-integrated circuit (I2C) protocol channel. The data storage structure is configured to store five data words and respective appended ECCs.

In another aspect, the invention may be a method of recovering data that has been corrupted in a dynamic random-access memory (DRAM) device. The method may comprise performing a refresh operation of the DRAM device, and for each data word and appended error correction code (ECC) check bits, (i) generating, by an ECC generator, expected ECC check bits based on the data word, (ii) when the expected ECC check bits match the appended ECC check bits, storing the data word and appended ECC check bits to the memory device, (iii) when the expected ECC check bits do not match the appended ECC check bits, and an error in the data word cannot be corrected, (a) searching a CPU cache coherence hierarchy associated with the memory device to identify a copy of the data word, and (b) reformulating a write to the DRAM device using the copy of the data word to replace the data word.

The method may further comprise initiating the searching of the CPU cache coherence hierarchy through a response channel from a memory controller to a coherent fabric associated with at least one processing core. Searching a CPU cache coherence hierarchy may further comprise sending a snoop to processing agents in the CPU cache coherence hierarchy to identify a cache line that contains a copy of the data word. The method may further comprise disposing the ECC generator on a memory controller associated with the memory device, and determining on the memory device that the expected ECC check bits match the appended ECC check bits.

In another aspect, the invention may be an apparatus configured to recover data that has been corrupted in a dynamic random-access memory (DRAM) device. The apparatus may comprise a memory controller operatively coupled to the DRAM device. The memory controller may be configured to perform a refresh operation of the DRAM device, and for each data word and appended error correction code (ECC) check bits, (i) an ECC generator may generate expected ECC check bits based on the data word, (ii) when the expected ECC check bits match the appended ECC check bits, the memory controller may store the data word and appended ECC check bits to the memory device, (iii) when the expected ECC check bits do not match the appended ECC check bits, and an error in the data word cannot be corrected, (a) the memory controller cooperates with a coherent fabric to search a CPU cache coherence hierarchy associated with the memory device to identify a copy of the data word, and (b) the memory controller reformulates a write to the DRAM device using the copy of the data word to replace the data word.

The searching of the CPU cache coherence hierarchy may be initiated through a response channel from a memory controller to a coherent fabric associated with at least one processing core. The memory controller sends a snoop to processing agents in the CPU cache coherence hierarchy to identify a cache line that contains a copy of the data word. The ECC generator is disposed on a memory controller associated with the memory device, and the memory device determines that the expected ECC check bits match the appended ECC check bits.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

The teachings of all patents, published applications and references cited herein are incorporated by reference in their entirety.

The described embodiments are directed to improving the robustness and reliability of the data interface between a processor system on chip (SOC) and associated external memory such as dynamic random-access memory (DRAM). While one skilled in the art would recognize that the DRAM devices may be configured in a SIMM or DIMM configuration, for simplicity the described embodiments refer to external memory simply as DRAM.

Figure 1:
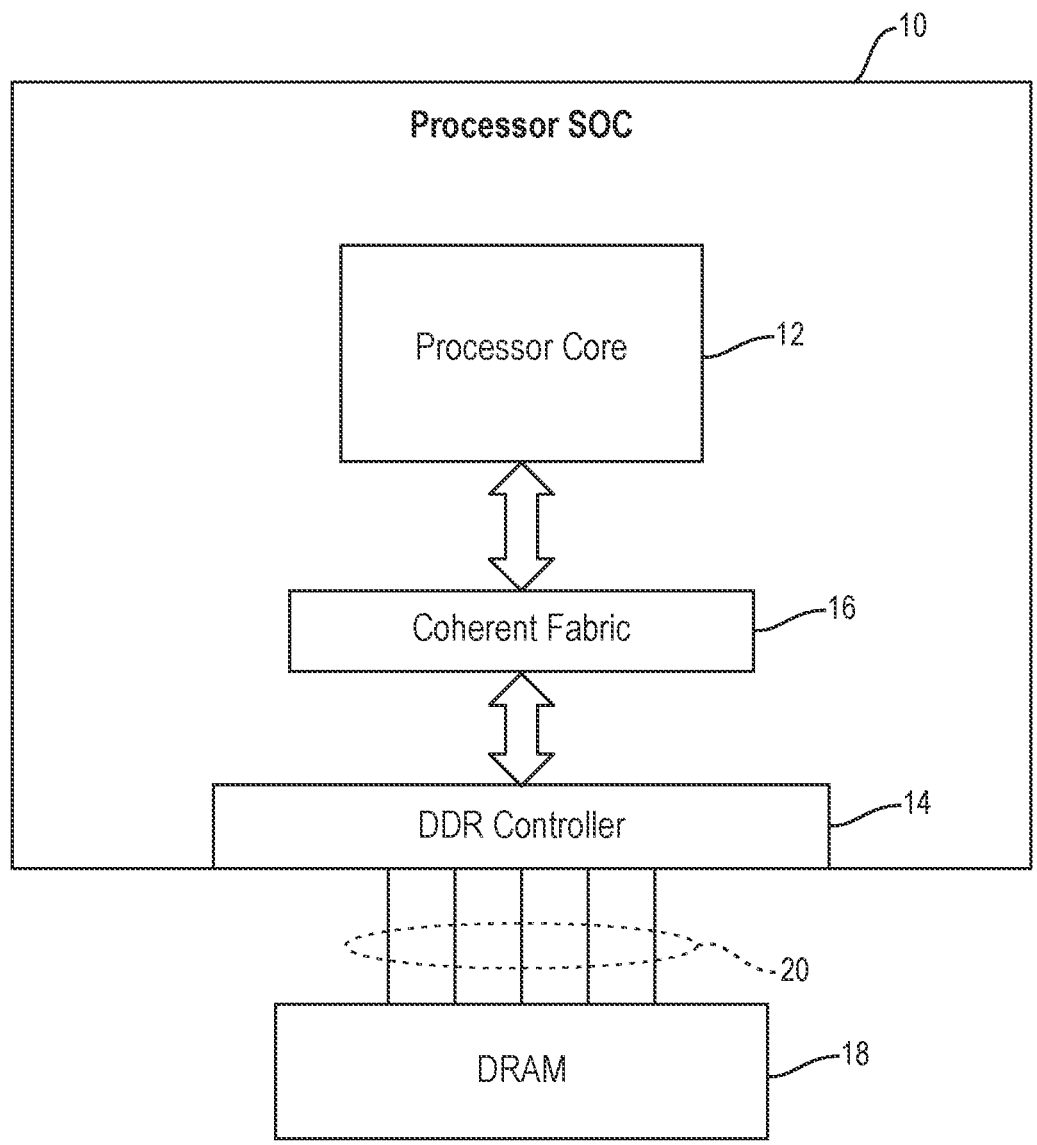
FIG. 1 shows a high-level view of a prior art processor and data storage architecture.
Figure 2:
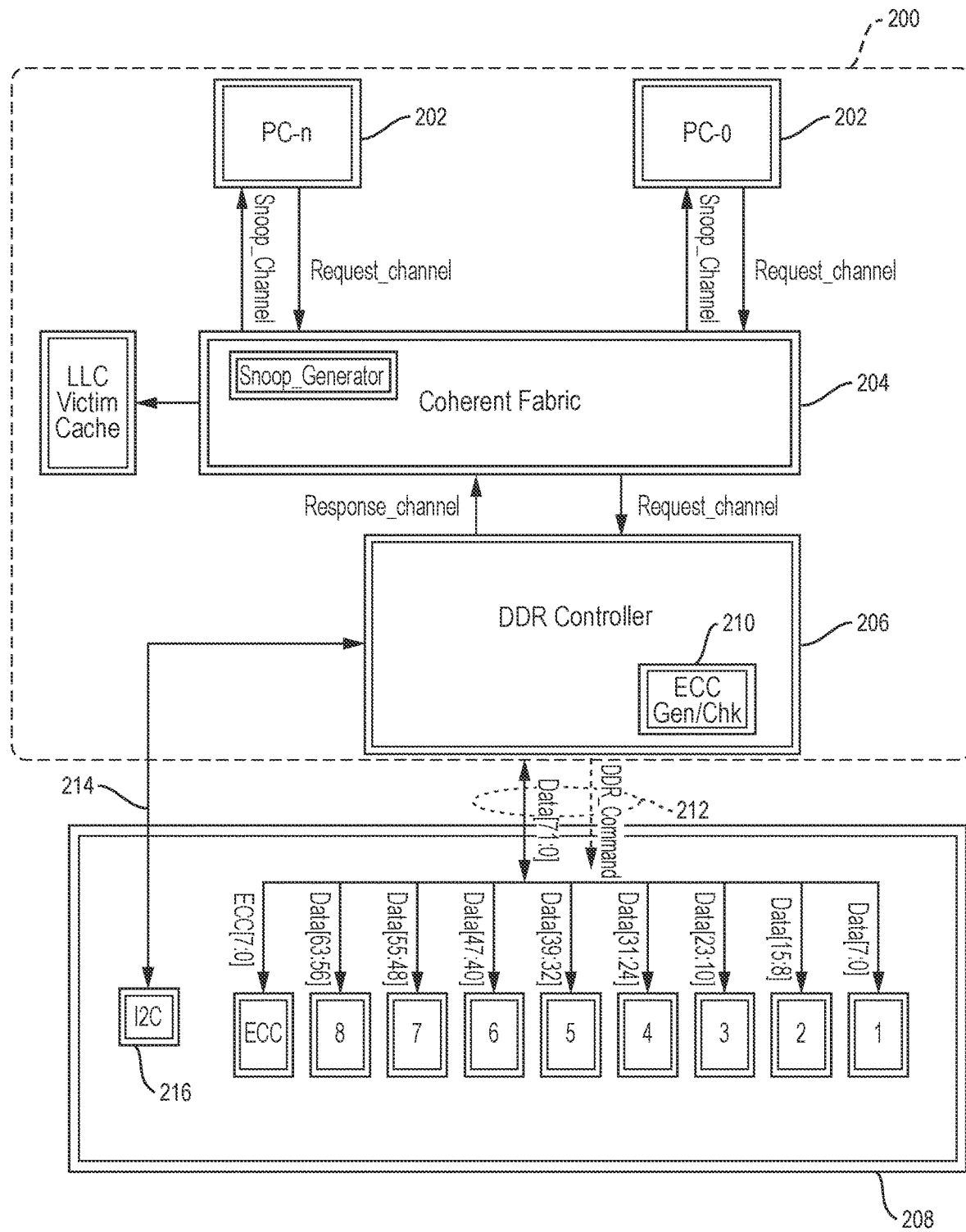
FIG. 2 shows a processor and data storage architecture according to the invention.

FIG. 2 shows a more detailed view of the architecture depicted in FIG. 1. FIG. 2 shows n+1 processor cores 202 (PC-0 through PC-n) on the SOC 200. In this embodiment, each of the processor cores 202 communicates with a double data rate (DDR) controller 206 through a coherent fabric 204. In this embodiment, only one DDR controller 206 is shown for simplicity, although in other embodiments two or more DDR controllers may be used. In addition to a primary data and DDR command interface 212 between the DDR controller 206 and the DRAM 208, a sideband channel 214 may also exist for auxiliary communications between the DDR controller 206 and the DRAM 208. The sideband channel 214 may be implemented as an inter-integrated circuit (I2C) using I2C transceivers 216, as is known in the art, although other communication protocols known in the art may alternatively be used.

Errors may be introduced into the data words transferred across the SOC-to-external memory interface (i) when the data word is transferred from the SOC 200 to the DRAM 208, (ii) when the data word is transferred from the DRAM 208 to the SOC 200, and (iii) during the time that the data resides in the DRAM 208. The error correction code (ECC) processing that is performed by the ECC generation and check module 210, described below, can detect certain errors due to any and all of the above-mentioned three error sources.

The DDR controller 206 comprises an error correction code (ECC) generation and check module 210, which generates ECC bits to be appended to each 64-bit data word transferred to the DRAM 208 (where the ECC bits are determined by the generation and check module 210 based on the relevant 64-bit word), and determines if the 64-bit data word and its ECC bits transferred from the DRAM 208 to the DDR controller 206 are correct. In the example embodiments, the ECC is a single error correction, double error detection (SECDED) ECC, such as a distance-four Hamming code, which means that the ECC can detect up to two errors in the codeword (i.e., the 64 data bits with eight ECC check bits appended thereto). It should be understood that other ECC schemes may alternatively be used, and that the ECC module may comprise hardware and/or software code to perform the described coding.

For data words transferred from the DRAM 208 to the DDR controller 206, the ECC generation and check module 210 determines expected ECC bits based the received 64-bit data word, then compares the expected ECC word to the actual ECC bits received with the received 64-bit data word. When the expected ECC bits match the received ECC bits, the data word is forwarded along designated paths through the coherent fabric 204. If the ECC bits associated with the 64-bit data word are determined to be incorrect, the ECC generation and check module 210 attempts to correct the error condition. If the ECC generation and check module 210 can correct the error condition, it does so and forwards the 64-bit data word along designated paths through the coherent fabric 204. In some cases, the detected error is beyond the capability of the error correction/detection scheme to completely mitigate. For example, as described above, a SECDED coding scheme can detect two errors but can only correct one error. For such situations, the example embodiments described herein present one or more structures and/or procedures for correcting the corrupted data without relying on the ECC scheme.

Further, when a codeword includes more errors than the ECC is capable of correcting, the resulting corrupted codeword may actually be a different (but valid) codeword, which will not be identified as an error by the ECC generation and check module 210. To mitigate such situations, the example embodiments described herein present one or more structures and/or procedures for more frequently check/correct potential errors so that the errors do not accumulate beyond the capability of the ECC scheme.

Some of the described embodiments may incorporate a data storage structure, for examplea first-in-first-out (FIFO) 302 storage structure, as shown in the example embodiment, for storing recently sent data (and corresponding address) on the DDR controller 306. The FIFO 302 stores the most recent N data words and associated addresses that were sent to the DRAM 308 for storage, where N is a positive integer. In this example embodiment, N is five, although for other embodiments, N may be greater than or less than 5. Further, an ECC check module 304, which is configured to determine expected ECC check bits based the received 64-bit data word, may be incorporated on the DRAM 308. The ECC check module 304 may evaluate each incoming data word from the DDR controller 306 to determine if the expected ECC check bits match the ECC check bits that are appended to the incoming data word. If the expected ECC check bits do not match the incoming ECC check bits, the ECC check module 304 may attempt to correct the error as described herein. If the number of errors exceeds the capability of the ECC check module to correct, the ECC check module 304 may declare a data transfer fault associated with the incoming data word.

In this example embodiment, a "write" operation from the DDR controller 306 to the DRAM 308 includes a transfer, from the DDR controller 306 to the DRAM 308, of the data word to be stored along with the physical address of the DRAM memory location at which the data is to be stored. This write operation is accomplished by way of a set of DDR commands associated with the data to be transferred. A command decoder (not shown) on the DRAM 308 interprets the DDR commands to receive the information relevant to the write operation. The DRAM 308 conveys the address and data received from the DDR controller 306 back to the DDR controller through the sideband channel by way of the I2C transceiver 214.

Figure 3:
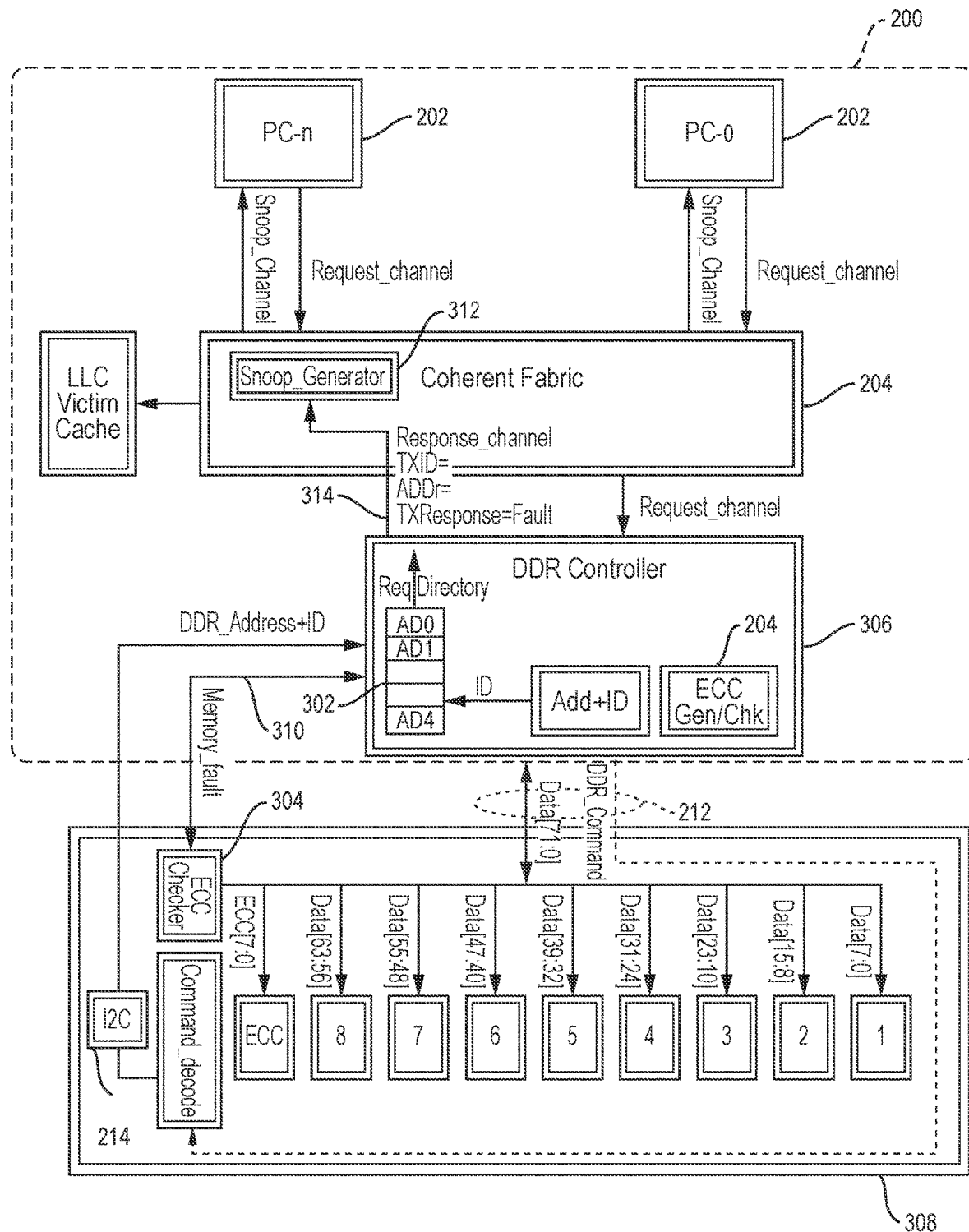
FIG. 3 shows a more detailed view of a processor and data storage architecture according to the invention.

Once the DRAM 308 receives the data word to be stored, the ECC check module 304 determines if an error exists in the data word. If the ECC check module 304 determines that an error exists in the data word, the ECC check module 304 may proceed to correct the error. If the error exceeds the error-correction capability of the ECC check module 304, the ECC check module 304 may declare a data transfer fault associated with the incoming data word, and communicate the data transfer fault by asserting a fault signal 310 (shown as Memory_fault 310 in FIG. 3) either directly to the DDR controller 306, or to the DDR controller 306 through the sideband channel by way of the I2C transceiver 214.

Upon receiving the fault signal 310, the DDR controller 306 may extract, from the FIFO 302, the data and address that corresponds to the write data that caused the fault signal 310. The DDR controller will then repeat the write operation that caused the fault signal 310, using the data and address that was stored in the FIFO 302 prior to the write operation.

In some embodiments, the DDR controller 306 may cooperate with the coherent fabric 204 and/or the processor(s) 202 to search for an uncorrupted copy of the data that was corrupted and caused the fault at the DRAM 308.

A DRAM device must be refreshed periodically (referred to herein as "self-refresh/auto refresh mode). During this refresh mode, the DRAM data read and subsequently re-written, so the refreshed data is visible at the data pins of the DRAM 308.

Some embodiments utilize this refresh mode to perform a periodic error check of the data stored in the DRAM 308. As each data word is read in the refresh cycle, the ECC generation and check module 210 evaluates that data word to determine if the expected ECC check bits match the ECC check bits that are appended to the data word being refreshed. If the expected ECC check bits do not match the ECC check bits appended to the data word being refreshed, the ECC generation and check module 210 may attempt to correct the error as described herein. When the number of errors present exceeds the correction capability of the ECC generation and check module 210, the ECC generation and check module 210 may determine that a data transfer fault exists associated with the data word being refreshed.

The corrupted data word in the above scenario may not have been one of the last N data words written, so the data word may not exist in the FIFO 302. A clean, uncorrupted version of the corrupted data word, however, may be currently exist in the CPU cache coherence hierarchy. Accordingly, in some embodiments the DDR controller 306 may cooperate with a snoop generator 312 in the coherent fabric 204 to determine which cache line is associated with the relevant data word (i.e., an uncorrupted version of the corrupted data word) and to determine if that cache line has a copy of the relevant data word. If a cache line is found that currently maintains an uncorrupted copy of the relevant data word, the DDR controller 306 may utilize the uncorrupted data word to reformulate a write to the DRAM 308 to replace the corrupted data word.

Communication channels between the DDR controller 306 and the coherent fabric 204 for cooperating to determine if an uncorrupted version of the relevant data word already exists in the response channel 314. This embodiment adds one or more commands to the protocol of the response channel 314 to (i) convey the fact of a failed ECC check at the DDR controller, (ii) to request a search of the cache coherence hierarchy for an uncorrupted version of the relevant data word, and (iii) to generate a write transaction to re-write the uncorrupted data word. Specific encoding of the response channel protocol indicates to the coherent fabric 204 that added commands are spontaneous (i.e., not a response to a message conveyed on the request channel).

While example embodiments have been particularly shown and described, it will be understood by those skilled in the art that various changes in form and details may be made therein without departing from the scope of the embodiments encompassed by the appended claims.

What is claimed is:

1. A method of recovering data that has been corrupted at an interface between a memory controller and a memory device, comprising:
   providing a data storage structure on the memory controller;
   providing an error correction code (ECC) generator to the memory device, the ECC generator configured to generate ECC check bits based on a data word;
   for each data word, appended ECC check bits, and associated address that is conveyed from the memory controller to the memory device:
   (i) storing a copy of the data word, appended ECC check bits, and associated address into the data storage structure;
   (ii) generating, by the ECC generator, expected ECC check bits based on the data word;

(iii) when the expected ECC check bits match the appended ECC check bits, storing the data word and appended ECC check bits to the memory device; and (iv) when the expected ECC check bits do not match the appended ECC check bits, and an error in the data word cannot be corrected, replacing the data word and appended ECC check bits with the copy of the data word and appended ECC that were stored in the data storage structure.

2. The method of claim 1, further comprising communicating, by the memory device to the memory controller, that the data word is corrupted and cannot be corrected through a sideband channel.

3. The method of claim 1, further comprising communicating, by the memory device to the memory controller, that the data word is corrupted and cannot be corrected through a direct connection from the memory device to the memory controller.

4. The method of claim 1, further comprising communicating, by the memory device, the physical address associated with the corrupted data word through a sideband channel.

5. The method of claim 2, further comprising implementing the sideband channel with an inter-integrated circuit (I2C) protocol channel.

6. The method of claim 1, wherein the data storage structure is configured to store five data words and respective appended ECCs.

7. The method of claim 1, wherein the data storage structure is a first-in-first-out (FIFO) data structure.

8. An apparatus for recovering data that been corrupted at an interface between a memory controller and a memory device, comprising:

a data storage structure disposed on the memory controller;

an error correction code (ECC) generator disposed on the memory device, the ECC generator generates ECC check bits based on a data word;

for each data word, appended ECC check bits, and associated address conveyed from the memory controller to the memory device, the apparatus:

(i) stores a copy of the data word, appended ECC check bits, and associated address into the data storage structure;

(ii) generates, by the ECC generator, expected ECC check bits based on the data word;

(iii) when the expected ECC check bits match the appended ECC check bits, stores the data word and appended ECC check bits to the memory device; and (iv) when the expected ECC check bits do not match the appended ECC check bits, and an error in the data word cannot be corrected, replaces data word and appended ECC check bits with the copy of the data word and appended ECC stored in the data storage structure.

9. The apparatus of claim 8, wherein the memory device communicates to the memory controller through a sideband channel that the data word is corrupted and cannot be corrected.

10. The apparatus of claim 8, wherein the memory device communicates to the memory controller that the data word is corrupted and cannot be corrected through a direct connection from the memory device to the memory controller.

11. The apparatus of claim 8, wherein the memory device communicates to the memory controller the physical address associated with the corrupted data word through a sideband channel.

12. The apparatus of claim 8, wherein the sideband channel is implemented with an inter-integrated circuit (I2C) protocol channel.

13. The apparatus of claim 8, wherein the data storage structure is configured to store five data words and respective appended ECCs.

14. The apparatus of claim 8, wherein the data storage structure is a first-in-first-out data structure.

15. A method of recovering data that has been corrupted in a dynamic random-access memory (DRAM) device, comprising:

performing a refresh operation of the DRAM device, and for each data word and appended error correction code (ECC) check bits:

(i) generating, by an ECC generator, expected ECC check bits based on the data word;

(ii) when the expected ECC check bits match the appended ECC check bits, storing the data word and appended ECC check bits to the memory device; and (iii) when the expected ECC check bits do not match the appended ECC check bits, and an error in the data word cannot be corrected:

(a) searching a CPU cache coherence hierarchy associated with the memory device to identify a copy of the data word; and (b) reformulating a write to the DRAM device using the copy of the data word to replace the data word.

16. The method of claim 15, further comprising initiating the searching of the CPU cache coherence hierarchy through a response channel from a memory controller to a coherent fabric associated with at least one processing core.

17. The method of claim 15, wherein searching a CPU cache coherence hierarchy further comprises sending a snoop to processing agents in the CPU cache coherence hierarchy to identify a cache line that contains a copy of the data word.

18. The method of claim 15, further comprising disposing the ECC generator on a memory controller associated with the memory device, and determining on the memory device that the expected ECC check bits match the appended ECC check bits.

19. An apparatus for recovering data that has been corrupted in a dynamic random-access memory (DRAM) device, comprising:

a memory controller operatively coupled to the DRAM device, the memory controller configured to perform a refresh operation of the DRAM device, and for each data word and appended error correction code (ECC) check bits:

(i) an ECC generator generates expected ECC check bits based on the data word;

(ii) when the expected ECC check bits match the appended ECC check bits, the memory controller stores the data word and appended ECC check bits to the memory device; and (iii) when the expected ECC check bits do not match the appended ECC check bits, and an error in the data word cannot be corrected:

(a) the memory controller cooperates with a coherent fabric to search a CPU cache coherence hierarchy associated with the memory device to identify a copy of the data word; and (b) the memory controller reformulates a write to the DRAM device using the copy of the data word to replace the data word.

20. The apparatus of claim 19, wherein the searching of the CPU cache coherence hierarchy is initiated through a response channel from a memory controller to a coherent fabric associated with at least one processing core.

21. The apparatus of claim 19, wherein the memory controller sends a snoop to processing agents in the CPU cache coherence hierarchy to identify a cache line that contains a copy of the data word.

22. The apparatus of claim 19, wherein the ECC generator is disposed on a memory controller associated with the memory device, and the memory device determines that the expected ECC check bits match the appended ECC check bits.

23. An apparatus for recovering data that been corrupted at an interface between a memory controller and a memory device, comprising:
- means for storing data disposed on the memory controller;
- means for generating ECC check bits based on a data word;
- for each data word, appended ECC check bits, and associated address conveyed from the memory controller to the memory device, the apparatus is configured to:
  - (i) store a copy of the data word, appended ECC check bits, and associated address into the means for storing data;
  - (ii) generate, by the means for generating ECC check bits, expected ECC check bits based on the data word;
  - (iii) when the expected ECC check bits match the appended ECC check bits, store the data word and appended ECC check bits to the memory device; and
  - (iv) when the expected ECC check bits do not match the appended ECC check bits, and an error in the data word cannot be corrected, replace data word and appended ECC check bits with the copy of the data word and appended ECC stored in the means for storing data.

24. An apparatus for recovering data that has been corrupted in a dynamic random-access memory (DRAM) device, comprising:
- means for controlling memory, operatively coupled to the DRAM device, the means for controlling memory configured to perform a refresh operation of the DRAM device, and for each data word and appended error correction code (ECC) check bits:
  - (i) means for generating ECC check bits generates expected ECC check bits based on the data word;
  - (ii) when the expected ECC check bits match the appended ECC check bits, the means for controlling memory stores the data word and appended ECC check bits to the memory device; and
  - (iii) when the expected ECC check bits do not match the appended ECC check bits, and an error in the data word cannot be corrected:
    - (a) the means for controlling memory cooperates with a coherent fabric to search a CPU cache coherence hierarchy associated with the memory device to identify a copy of the data word; and
    - (b) the means for controlling memory reformulates a write to the DRAM device using the copy of the data word to replace the data word.

* * * * *